(12) United States Patent
Lee

(10) Patent No.: US 11,031,090 B1
(45) Date of Patent: Jun. 8, 2021

(54) ANALOG CURRENT MEMORY WITH DROOP COMPENSATION

(71) Applicant: Omni Design Technologies Inc., Milpitas, CA (US)

(72) Inventor: Hae-Seung Lee, Lexington, MA (US)

(73) Assignee: Omni Design Technologies Inc., Milpitas, CA (US)

( * ) Notice: Subject to any disclaimer, the term of this patent is extended or adjusted under 35 U.S.C. 154(b) by 0 days.

(21) Appl. No.: 16/738,452

(22) Filed: Jan. 9, 2020

(51) Int. Cl.
*G11C 27/00* (2006.01)
*G06N 3/02* (2006.01)

(52) U.S. Cl.
CPC .............. *G11C 27/005* (2013.01); *G06N 3/02* (2013.01)

(58) Field of Classification Search
CPC ................................ G11C 27/005; G06N 3/02
See application file for complete search history.

(56) References Cited

U.S. PATENT DOCUMENTS

| 2012/0134196 A1* | 5/2012 | Evans, Jr. | ............ G11C 27/005 365/145 |
| 2012/0313104 A1* | 12/2012 | Liu | ........................ H01L 33/08 257/71 |
| 2015/0016175 A1* | 1/2015 | Evans, Jr. | ............. G11C 11/221 365/145 |

* cited by examiner

Primary Examiner — Tri M Hoang
(74) Attorney, Agent, or Firm — Intrinsic Law Corp.

(57) ABSTRACT

An analog current memory circuit includes a ramp current generator producing a ramp current; a storage transistor, a write-enable transistor, a charge pump transistor, a clock generator producing a clock signal having a first state and a second state, a comparator electrically coupled to the storage transistor and the ramp current generator, a controller electrically coupled to the comparator and the clock generator, and a switch electrically coupled to the controller and the ramp current generator. During the write phase, the controller produces a write-enable signal to turn on the write-enable transistor to produce a stored current in the storage transistor, the stored current being substantially equal to an input current to the analog current memory circuit. During the compensation phase, the switch electrically couples the ramp current generator and the storage transistor to the comparator.

14 Claims, 6 Drawing Sheets

ANALOG CURRENT MEMORY WITH DROOP COMPENSATION

TECHNICAL FIELD

This application generally relates to analog memory circuits.

BACKGROUND

Neural networks (NNs) are widely used in applications such as speech, pattern, and image recognition, autonomous navigation, financial forecasting, and many others. A large amount of data, such as filter weights and input feature maps, are stored and processed in the neural networks. Most of the data processing is in the form of a multiply-and-accumulate (MAC) operation. In order to speed up data processing, multiple parallel processors are typically utilized. Each processer in the multiprocessor architecture is referred to as a processing element (PE). The PEs fetch the data corresponding to the filter weights and the input feature maps from memory and write the processed data back to the memory.

Dynamic random-access memory (DRAM) provides a large data storage capacity and is often employed as data storage in NNs. However, the DRAM fabrication technology differs substantially from CMOS technologies used to build processors. For this reason, in most NNs, the DRAMs are in separate integrated circuit packages; thus the data storage in DRAMs is off-chip. In other words, the DRAM data storage is off the processor chip. In this arrangement, the PEs must access data from the off-chip DRAMs each time the data is fetched and processed, increasing the latency, and more importantly, the energy consumption. This is because accessing the off-chip DRAM data is slow and consumes orders of magnitude more energy than accessing data from on-chip registers, often more energy than the MAC operation. For this reason, in most modern NNs, various ranks of local static random-access memory (SRAM) are integrated on the processer chip in addition to the off-chip DRAMs. An SRAM cell requires at least 6 MOS transistors, hence, the density of memory feasible on the processor chip is much more limited than the off-chip DRAMs.

Another limitation of conventional digital NNs is that SRAMs and DRAMs typically store the data in a 1-bit digital value in each memory cell. Multibit memory cells can increase storage capacity, but they typically require special devices, for example memristors or floating gate transistors, which are not compatible with standard CMOS technologies. Therefore, clever data flow techniques have been developed to utilize both the large capacity off-chip DRAMs and limited capacity on-chip SRAMs in order to reduce the overall energy consumption.

The need for higher-speed and lower-power NNs are increasing dramatically as the application space for NNs grows exponentially. Analog neural networks (ANNs) have been proposed as a lower-power, higher-speed alternative to the conventional digital neural networks. Resistive memory devices such as memristors have been proposed as analog memory elements to store filter weights and feature maps in the form of conductance of the resistive memory. Memristors can store information as variable conductance in an analog form, thus a single memory cell can store information corresponding to multi bit memory elements. Such analog storage capability also enables analog computation instead of the conventional digital computation. The input from the feature map is provided as the voltage applied to one terminal of each memristor. The output current $I_{oi}$ of an i-th memristor is then the product between the input voltage $V_{Ii}$, and the conductance of the memristor $G_i$.

$$I_{oi} = V_{Ii} * G_i \qquad (1)$$

The outputs of M memristors in a column are tied together to sum the currents from the memristors, producing a total column output current $I_{oT}$.

$$I_{oT} = \sum_1^M I_{oi} = \sum_1^M V_{Ii} * G_i \qquad (2)$$

As can be seen in Eq. (2), the column output is the multiplication of the input and the weight summed together, equivalent to a MAC operation. Since both the input and the weight are analog, each input/weight product in Eq. (2) corresponds to multibit digital multiplication. In addition, since the total column output current is the sum of products, it represents a multibit MAC result. The key advantage of memristor based ANN is that a single memristor performs multibit filter weight storage and multiplication. The resulting MAC operation is performed in parallel by all memristors in a column, providing potentially a much higher throughput compared with the digital implementation. In addition, due to the analog storage and computation that correspond to the multibit digital counterparts, there is potentially huge area and power savings. One key drawback of memristors is that they are not available in standard CMOS technologies. In addition, their variability across the chip significantly limits accuracy. Also, endurance and high-voltage requirements present practical challenges for utilizing memristors in analog neural networks.

Current copier cells may be utilized in ANNs instead of memristors for full compatibility with standard CMOS. FIG. 1 shows a prior art current copier cell, comprising a storage transistor M1, write-enable (WE) transistor M2, and a cell select transistor M3. $C_P$ is a parasitic capacitance at the gate node of M1. During the write mode, the input current IN is directed to the storage transistor M1 by turning the cell select transistor M3 on. The WE transistor M2 is also turned on. Due to the negative feedback applied through M2, the gate voltage of M1 adjusts itself such that the drain current $I_O$ of M1 matches the input current $I_{IN}$. Once the gate voltage of M1 settles, M2 is turned off first, and shortly thereafter, M3 is turned off. The gate voltage $V_1$ that produces M1's drain current $I_D$ equal to $I_{IN}$ is stored in $C_P$, thus the cell is effectively storing the input current $I_{IN}$. During the read phase, M2 remains off, and only M3 is turned on. The output current, which is the drain current $I_D$ of M3 that is equal to $I_{IN}$, is routed to the output, reproducing the current written in the cell. The accuracy of the current memory cell is affected by charge injection from M2. When M2 is turned off, a portion of its channel charge is injected on $C_P$, lowering the gate voltage $V_1$ of M1. In addition, $V_1$ is dragged down by the overlap capacitance of M2 between its gate and the source (the gate node of M1) when M2 is turned off. The aggregate effect, referred to as charge injection, causes a negative error in $V_1$, which in turn causes $I_O$ to be lower than $I_{IN}$. Since the error in $V_1$ caused by charge injection is constant, it can be pre-compensated by increasing $I_{IN}$ or by utilizing a dummy device.

The second source of error is the leakage current through M2. Even when M2 is desired to be turned off by lowering its gate voltage to the ground potential, subthreshold current leaks charge from $C_P$. This causes a time-dependent droop in the voltage $V_1$, causing a corresponding droop in the output current $I_O$. The subthreshold leakage current is a strong function of temperature. It also varies with the threshold voltage of M2, which varies from cell-to-cell, as well as run-to-run. As a result, the leakage current can vary by a large factor due to temperature and threshold-voltage variations. This makes it difficult to compensate for the droop in the output current caused by the leakage current.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to an analog current memory circuit operable in a write phase and a compensation phase, the compensation phase repeating a plurality of times after each write phase, comprising: a ramp current generator producing a ramp current; a storage transistor, a write-enable transistor, and a charge pump transistor; a clock generator producing a clock signal having a first state and a second state; a comparator electrically coupled to the storage transistor and the ramp current generator; a controller electrically coupled to the comparator and the clock generator; and a switch electrically coupled to the controller and the ramp current generator. During the write phase, the controller produces a write-enable signal to turn on the write-enable transistor to produce a stored current in the storage transistor, the stored current being substantially equal to an input current to the analog current memory circuit. During the compensation phase, the switch electrically couples the ramp current generator and the storage transistor to the comparator.

In one or more embodiments, the comparator flips at a time the ramp current exceeds the stored current; and the controller produces a charge pump signal to turn on the charge pump transistor to increase the stored current by a predetermined increment when the comparator flips during the first state of the clock signal. In one or more embodiments, the storage transistor and the write-enable transistor comprise NMOS transistors and the charge pump transistor comprises a PMOS transistor. In one or more embodiments, the first state of the clock phase is "1." In one or more embodiments, the first state of the clock phase is "0."

In one or more embodiments, the controller comprises a digital memory having a first and a second memory state, wherein: during a first compensation phase after the write phase, said digital memory is set to a first memory state when the comparator flips during the first state of the clock signal; said digital memory is set to the second memory state when the comparator flips during the second state of the clock signal; and during subsequent compensation phases after the write phase, the controller produces a charge pump signal to turn on the charge pump transistor to increase the stored current by a predetermined increment when the comparator flips during the second state of the clock signal when the digital memory is set to the first memory state; the controller produces a charge pump signal to turn on the charge pump transistor to increase the stored current by a predetermined increment when the comparator flips during the first state of the clock signal when the memory is set to the second memory state.

In one or more embodiments, the storage transistor and the write-enable transistor comprise NMOS transistors and the charge pump transistor comprises a PMOS transistor.

Another aspect of the invention is directed to an analog current memory circuit organized in a plurality of rows and columns, each column comprising: a plurality of current memory cells each memory cell operable in a write phase and a compensation phase, and each memory cell comprising a storage transistor, a write-enable transistor, a row select transistor, and a charge pump transistor; a column line electrically coupled to said plurality of current memory cells; a ramp current generator producing a current ramp; a comparator electrically coupled to the column line and a bias voltage; a clock signal having a first state and a second state; a column switch electrically coupled to a column input current and the ramp current generator; and a column controller electrically coupled to the plurality of memory cells and the comparator.

In one or more embodiments, the analog current memory circuit further comprises a plurality of row controllers, each row controller producing a write enable signal, a row select signal, and a charge pump select signal for a respective row. In one or more embodiments, during the write phase of each row, each row controller produces the write-enable signal for the respective row, turning on the write-enable transistors in the current memory cells in the respective row; each column input current is electrically coupled to a respective column line and a respective column switch; and each column input current is stored in the storage transistor of the current memory cell in the respective column in the row.

In one or more embodiments, during the compensation phase of each row, each row controller produces the row select signal and the charge pump select signal for the respective row, directing the output currents of the storage transistors of the current memory cells in the respective row to the respective column lines; each column controller produces a charge pump signal when the comparator in the respective column flips during the first state of the clock signal; and said charge pump signal is electrically coupled to the charge pump transistor and the storage transistor of the current memory cell of the respective column in the row, incrementing the output current of the storage transistor in the same current memory cell by a predetermined amount. In one or more embodiments, each column controller comprises a digital memory having a first and a second memory state for the respective row; during a first compensation phase after the write phase for each row, said digital memory is set to the first memory state when the comparator in the respective column flips during the first state of the clock signal; said digital memory is set to the second memory state when the comparator in the corresponding column flips during the second state of the clock signal; during the second and the subsequent compensation phases after the write phase for each row, each column controller produces a charge pump signal to turn on the charge pump transistor in the current memory cell of the respective column in the row to increase the output current of a respective storage transistor by a predetermined increment when the comparator in the corresponding column flips in the second state of the clock signal when the memory is set to the first memory state; and the column controller produces a charge pump signal to turn on the charge pump transistor to increase the output current of the respective storage transistor by a predetermined increment when the comparator in the corresponding column flips during the first state of the clock signal when the memory is set to the second memory state.

In one or more embodiments, the storage transistor, the write-enable transistor, and the row select transistor comprise NMOS transistors; and the charge pump transistor comprises a PMOS transistor. In one or more embodiments, the storage transistor, the write-enable transistor, and the row select transistor comprise PMOS transistors; and the charge pump transistor comprises an NMOS transistor.

BRIEF DESCRIPTION OF THE DRAWINGS

For a fuller understanding of the nature and advantages of the present concepts, reference is made to the following detailed description of preferred embodiments and in connection with the accompanying drawings. In the drawings, like reference characters generally refer to like features (e.g., functionally-similar and/or structurally-similar elements).

DETAILED DESCRIPTION

The inventor has recognized that it is advantageous to provide compensation for the droop such that an accurate level of current is stored in the current memory cell for an indefinite period of time. The inventor has also recognized that current copiers can be organized in rows and columns as a two-dimensional array analogous to digital memory to store analog information for ANNs. Since it is desirable to store a large number of filter weights simultaneously in ANNs, a large current memory array is desired. Therefore, the current memory cell is preferably made as small as possible and its power consumption is preferably made as low as possible. Consequently, the droop compensation circuitry is preferably small and low power.

Figure 1:
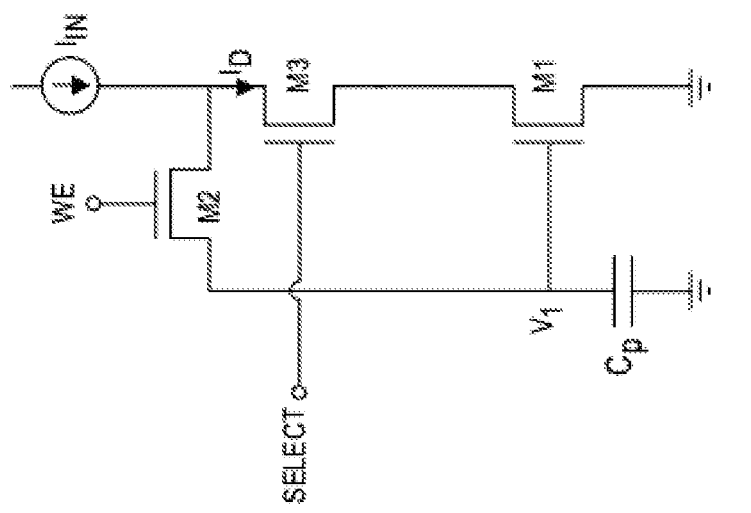
FIG. 1 is a schematic diagram of a current copier circuit according to the prior art.
Figure 2:
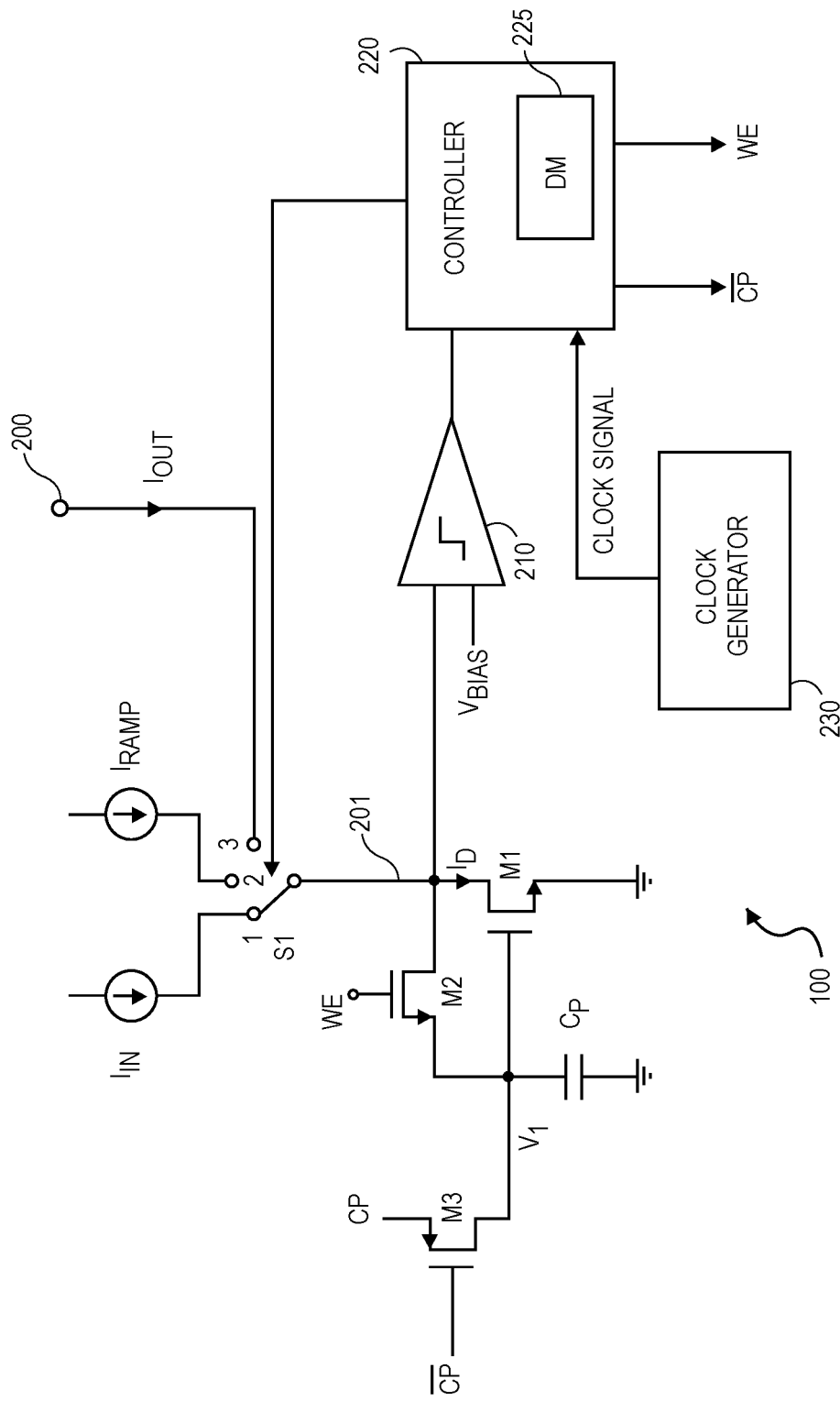
FIG. 2 is a schematic diagram of a current memory circuit according to an embodiment of the present invention.

FIG. 2 illustrates a first embodiment according to the present invention The memory cell 100 comprises a storage transistor M1, a write-enable (WE) transistor M2, a charge pump transistor M3, a three-position switch S1, and a current output terminal 200. An output current $I_{OUT}$ flows from the storage transistor M1 to the output terminal when the switch S1 is thrown to position 3. $C_P$ is the parasitic capacitance at the gate node of M1. As illustrated, the storage transistor M1 and the WE transistor M2 comprise NMOS transistors and the charge pump transistor M3 comprises a PMOS transistor. In an alternative embodiment, the storage transistor M1 and the WE transistor M2 comprise PMOS transistors and the charge pump transistor M3 comprises an NMOS transistor.

The embodiment further comprises a comparator 210, a controller 220, a clock generator 230, and a ramp current $I_{RAMP}$. During the write mode, the controller 220 directs an input current $I_{IN}$ to the drain 201 of M1 by throwing the switch S1 to position 1. The controller also turns on the WE transistor M2 (e.g., by setting the WE voltage to "high") and turns off the charge pump transistor M3 by setting the charge pump signal to "low" (e.g., CP=0V). Due to the negative feedback applied through M2, the gate voltage of M1 adjusts itself such that the drain current $I_D$ of M1 matches the input current $I_{IN}$. Once the gate voltage of M1 settles, M2 is turned off (e.g., by setting the WE signal to low such as 0V). The gate voltage $V_1$ that produce M1's drain current $I_D$ equal to IN is stored in $C_P$. Thus, initially after M2 is turned off, $$I_D = I_{IN} \quad (3)$$

For simplicity, we assume that the effect of the charge injection is compensated and is ignored here. After the voltage $V_1$ is stored on $C_P$, the controller throws the switch S1 to position 2 to direct the ramp current $I_{RAMP}$ to 201. If the ramp current is larger than the drain current of M1 $I_D$, i.e. $I_{RAMP} > I_D$, the voltage at 201 goes up high. On the other hand, if the ramp $I_{RAMP} < I_D$, the voltage at 201 goes down low. The comparator 210 compares the voltage at 201 with a bias voltage $V_{BIAS}$, in effect, determining if $I_{RAMP} > I_D$ or $I_{RAMP} < I_D$. The ramp waveform is synchronized with a clock signal produced by the clock generator 230, and the ramp repeats at a ramp interval of $T_R$. Since the ramp and the clock signal are synchronized, $T_R$ must be an integer multiple of the clock period T. When the ramp current exceeds the output current, the comparator output flips from "0" to "1." The controller receives the comparator output as well as the clock signal. The clock phase can have a first state and a second state. The first state of the clock phase can be "1" and the second state of the clock phase cans be "O." Alternatively, the first state of the clock phase can be "0" and the second state of the clock phase can be "1."

Figure 3:
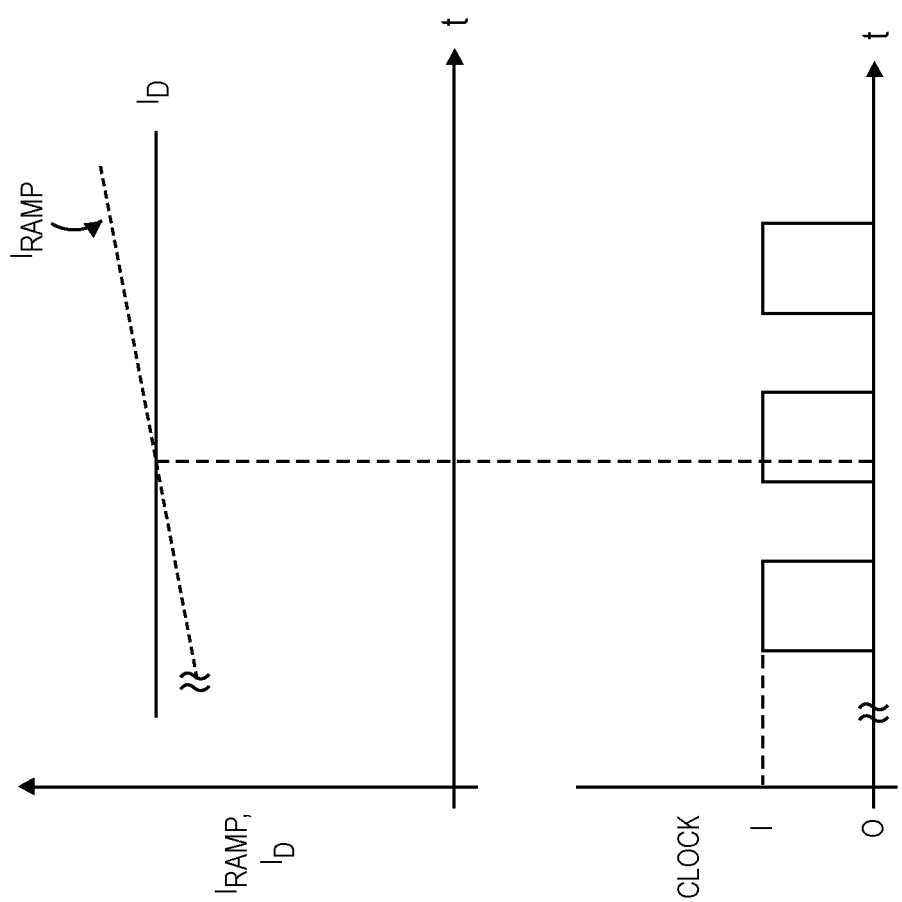
FIG. 3 shows the stored current, the ramp current, and the clock waveform with no droop in the stored current.

The controller records the comparator flipping clock phase, i.e. whether the clock phase is "1" or "0" at the time the comparator output flips. If there is no droop, the comparator output flips on the same clock phase the next time the ramp crosses the output current, since the ramp waveform is synchronized with the clock. For example, in FIG. 3, the ramp current $I_{RAMP}$ crosses the output current $I_D$ and the comparator flips on clock phase "1." Without any droop, the output current $I_D$ stays constant, and the ramp always crosses the output current on the clock phase "1"; thus the comparator always flips on clock phase "1."

Next, assume that there is a small amount of droop in the stored current $I_D$ at a constant rate DR. We assume here that the primary cause of the droop is the subthreshold leakage current through M2, and the droop always causes the output current to decrease over time. The droop $\Delta I$ in the output current after a period of time t is then:

$$\Delta I = DR \cdot t \quad (4)$$

Immediately after the WE switch M2 turns off, the output current is stored in the current memory cell, thus $I_D$ is equal to the input current $I_{IN}$ as in Eqn. (3). The current $I_D$ droops at the rate of DR, thus $I_D$ is a function of time;

$$I_D(t) = I_{IN} - DR \cdot t \quad (5)$$

Figure 4:
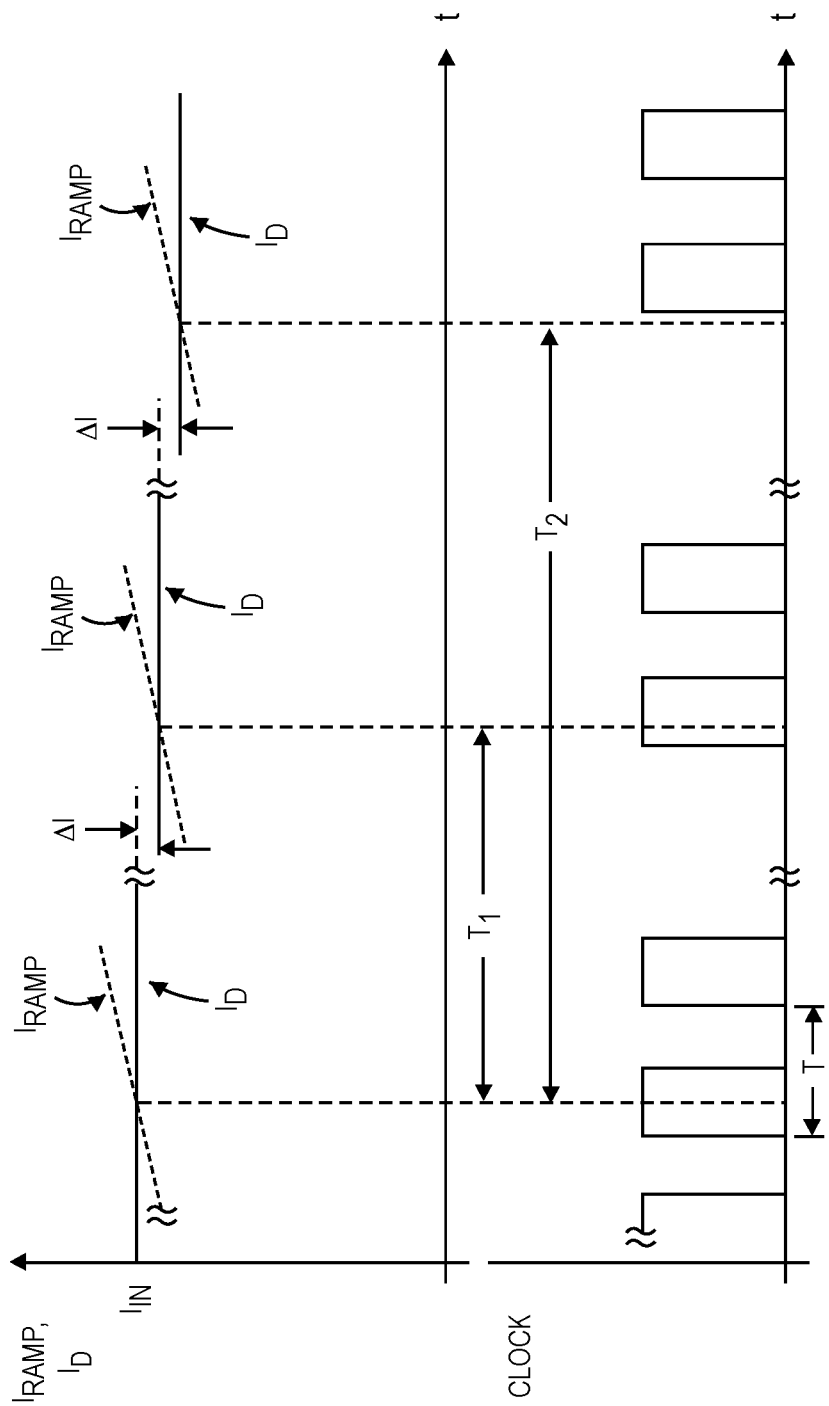
FIG. 4 shows the stored current, the ramp current, and the clock waveform with a small droop in the stored current.

Shortly after the WE switch M2 turns off, the ramp starts. Let's assume the ramp current $I_{RAMP}$ crosses the output current $I_D$ in the middle of the clock phase "1" the first time as shown in FIG. 4, at which time the comparator flips. For simplicity, we assume the droop rate is small such that the amount of the droop between the start of the ramp and the time the ramp crosses $I_D$ is negligible. At each new start of the ramp, $I_D$ has dropped by $DR \cdot T_R$ compared with its value at the previous ramp start. The comparator keeps flipping on clock phase "1" until the accumulated droop is large enough for the comparator to flip on clock phase "0." Examples are shown in FIG. 4, where the comparator flipping and clock phases are shown. The comparator flips when the ramp current $I_{RAMP}$ crosses $I_{IN}$. In FIG. 4, the comparator flipping initially occurs on clock phase "1". After a period of time $T_1$, the droop is still not large enough for the comparator flipping to occur on clock phase "0." However, after a longer period $T_2$, the comparator flips on clock phase "0." If the comparator flipping during the first ramp period ("first comparator flipping") occurred exactly in the middle of clock phase "1," the comparator will eventually flip on clock phase "0," if the accumulated droop exceeds $$RR \cdot \frac{T}{4},$$

where RR is the ramp rate (slope of the ramp). On the other hand, if the first comparator flipping occurred just before the falling edge of the clock, the accumulated droop must exceed $$RR \cdot \frac{T}{4}$$

for the comparator to flip on clock phase "0." If the first comparator flipping occurred just after the rising edge of the clock, only a tiny droop causes the comparator to flip on clock phase "0." Therefore, if the comparator flipping clock phase changes from "1" to "0" or "0" top "1," the droop is bound by:

$$0 < \Delta I < RR \cdot \frac{T}{2} \quad (6)$$

Once the comparator flipping clock phase changes, the controller 220 pulses the $C_P$ signal "high" for a short period of time, which turns on the charge pump transistor M3 momentarily to inject a small amount of positive charge on the gate of M1. This increases the $I_D$ by a small step of current $I_q$. The current $I_q$ must be made larger than the droop between the ramp starts in order to cause a net increase of $I_D$:

$$I_q > DR \cdot T_R \quad (7)$$

This ensures the there is a net increase in the stored cell current $I_D$ each time the charge is injected compared with the stored cell current $I_D$ one ramp period earlier. At the same time, $I_q$ must also be smaller than $RR \cdot T$ to ensure that under no circumstance should $I_D$ be increased enough for the comparator to flip at the same clock phase one clock period T later. Therefore, the desirable range of $I_q$ is given by $$DR \cdot T_R < I_q < RR \cdot T \quad (8)$$

At each comparator flipping, $I_D$ is increased by $I_q$ by the charge pump until the comparator flips on the original clock phase. Once the comparator begins flipping on the original clock phase, $I_D$ is assured to be no more than $$RR \cdot \frac{T}{2}$$

or me original stored current, which is equal to the input current $I_{IN}$. The charge pump transistor is no longer pulsed by the controller until the droop causes the comparator flipping phase to change again. Since the $I_q$ begins to be injected before the droop exceeds $$RR \cdot \frac{T}{2},$$

the stored current $I_D$ is maintained within $$\pm RR \cdot \frac{T}{2}$$

of the original amount at all times such that $$-RR \cdot \frac{T}{2} < I_e < RR \cdot \frac{T}{2} \quad (9)$$

where $I_e$ is the error in the stored current $I_D$. In other words, the stored current is maintained indefinitely within the error bounds given in Eqn. (9).

From Eqn. (8), the minimum value of $RR \cdot T$ is equal to $DR \cdot T_R$. Thus, the minimum range of the error current is:

$$-DR \cdot \frac{T_R}{2} < I_e < DR \cdot \frac{T_R}{2} \quad (10)$$

The optimum ramp period $T_R$ is determined by the accuracy requirement and the droop rate.

The first embodiment of the invention stores the clock phase on which the first comparator flipping occurs for each current memory cell, requiring one-bit memory per cell. For a single current memory cell, the single bit memory can be provided by an SRAM cell, for example digital memory 225 (DM) in controller 220. For example, the digital memory can have a first memory state when the first comparator flipping occurs in the first state of the clock signal, and the digital memory can have a second memory state when the first comparator flipping occurs in the second state of the clock signal.

Considering the overall complexity of the current memory cell and associated droop compensation circuitry, the SRAM represents only a fraction of the circuitry. However, the SRAM requirement presents a significant overhead if multiple current memory cells are organized to share the droop compensation circuitry. This is because a typical SRAM cell requires 6 transistors to store the bit, while the current memory cell requires fewer transistors per cell for effectively multibit storage.

A second embodiment according to the present invention mitigates this overhead at the cost of slight accuracy degradation. Instead of storing the first comparator flipping clock phase and operating the charge pump based on whether comparator flipping clock phase changed or not, the controller operates the charge pump to inject charge to increase the stored current by $I_q$ whenever the comparator flips on one of the clock phases, for example, "0," for all current memory cells, until the comparator begins to flip on the other clock phase, in this example, "1." In this embodiment, no memory is necessary to store the clock phase the comparator flipped during the first ramp period. If the first comparator flipping occurs on clock phase "1," the circuit works exactly the same as in the first embodiment, because comparator flipping on clock phase "0" represents a change in comparator flipping clock phase, and as in the first embodiment, the charge pump injects charge to increase the stored current by $I_q$ until comparator flipping clock phase changes back to the original clock phase of "1." In this case, as in the first embodiment, the stored current is maintained within $$\pm RR \cdot \frac{T}{2}$$

of the original amount at all times.

$$-RR \cdot \frac{T}{2} < I_e < RR \cdot \frac{T}{2} \quad (11)$$

where $I_O$ is the error in the stored current.

On the other hand, if the first comparator flipping occurs on clock phase "0," the charge pump immediately begins to inject charge to increase the stored current by $I_q$, until the comparator flipping clock phase changes to "1." It can be shown that the stored current is maintained within an error bound given by $$0 < I_e < RR \cdot T \quad (12)$$

where $I_e$ is the error in the stored current.

From Eqns. (11) and (12), the overall error bound is then:

$$-RR \cdot \frac{T}{2} < I_e < RR \cdot T \quad (13)$$

and the corresponding minimum range of the error current is:

$$-DR \cdot \frac{T_R}{2} < I_e < DR \cdot T_R \quad (14)$$

Compared with the first embodiment, the upper bound of the error is slightly increased. However, since there is no need to store the first comparator flipping clock phase for each current memory cell, the associated SRAM cell is not needed, greatly reducing the complexity requirement.

Figure 5:
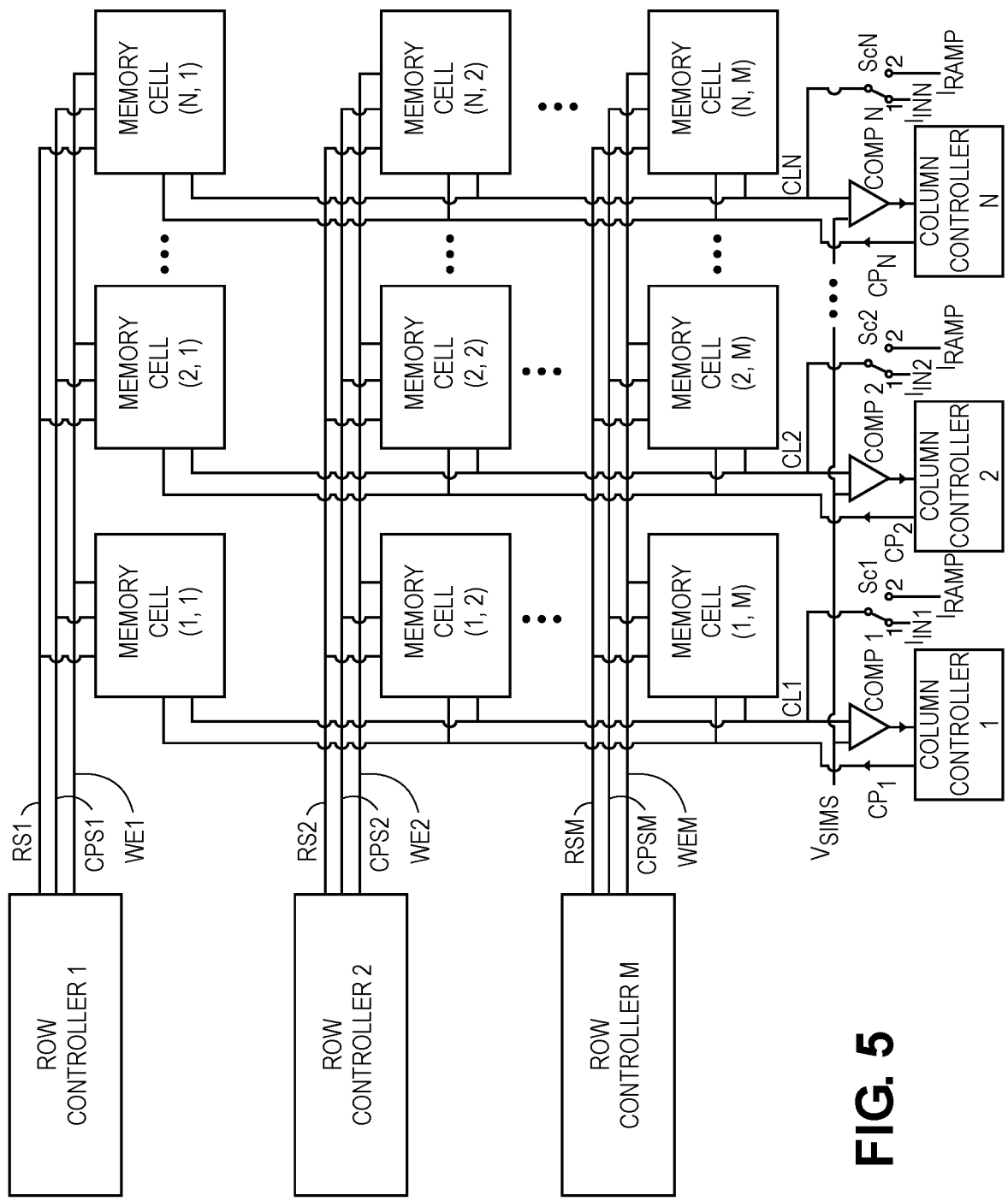
FIG. 5 is a block diagram of a current memory circuit organized in M rows and N columns according to an embodiment of the present invention.

In NN's, a large number of memory cells is required to store feature maps and weights. The current memory cells according to the present invention can be organized in rows and columns in a similar fashion to digital memory. FIG. 5 illustrates a third embodiment according to the present invention where memory cells are organized in M rows and N columns. For example, the first row, Row 1, has N memory cells from Memory Cell (1,1) to Memory Cell (N,1), and the last row, Row M has memory cells from Memory Cell (1, M) to Memory Cell (N,M). Each memory cell connects to 3 row control signals RS (row select), CPS (charge pump select), and WE (write enable), and 1 column control signal $C_P$ (charge pump). In addition, each memory cell couples to the column line CL. The row control signals (RS, CPS, and WE) are generated by respective Row Controller1-M for each row 1-M. For example, Row Controller 1 generates RS1, CPS1, and WE1. In general, Row Controller M generates RSM, CPSM, and WEM. The column control signals are generated by respective Column Controller1-N for each column 1-N.

Figure 6:
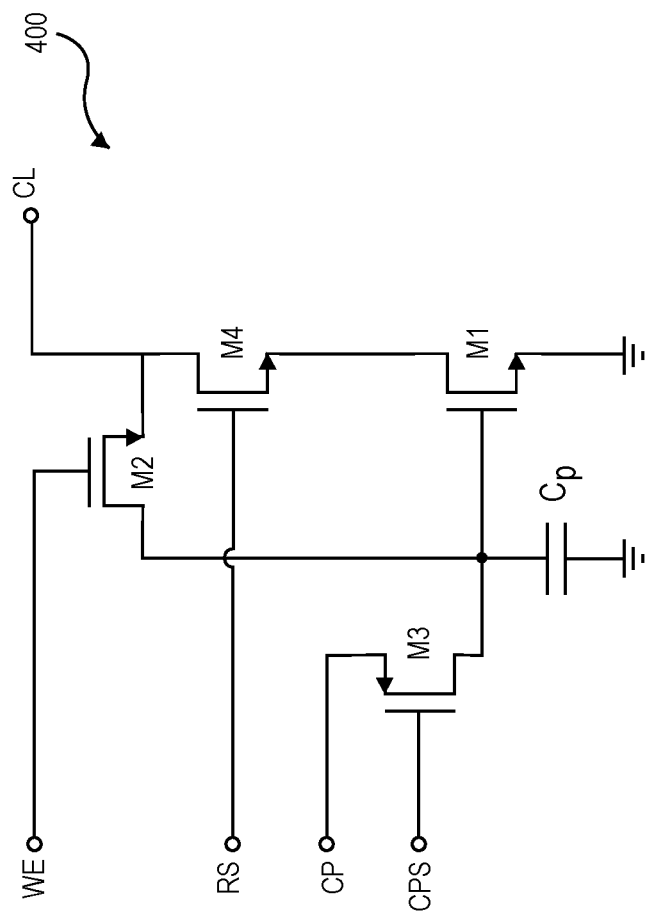
FIG. 6 is a schematic diagram of a current memory cell of the current memory circuit illustrated in FIG. 5.

The schematics of each memory cell are illustrated in FIG. 6. Each memory cell 400 comprises a storage transistor M1, a WE transistor M2, a charge pump transistor M3, and a row-select (RS) transistor M4. $C_P$ is the parasitic capacitance at the gate node of M1. As illustrated, the storage transistor M1, the WE transistor M2, and the RS transistor M4 comprise NMOS transistors and the charge pump transistor M3 comprises a PMOS transistor. In an alternative embodiment, the storage transistor M1 and the WE transistor M2 comprise PMOS transistors and the charge pump transistor M3 comprises an NMOS transistor.

The gate of the RS transistor M4 connects to the RS signal of the corresponding row that the memory cell is situated in. Likewise, The gate of the $C_P$ transistor M3 connects to corresponding CPS signal, and the gate of the WE transistor M2 connects to the WE signal of the corresponding row. In addition, the source of the $C_P$ transistor M3 connects to the corresponding column's $C_P$ signal, and the drain of the RS transistor M4 connects to the corresponding column line CL signal.

During the write mode of a row, in Step 1, the column input currents to be stored in the current memory cells are directed to the column lines, and the WE signal and the RS signal for the row being written are set to "1," turning on WE and RS transistors in all cells in that row. Referring to FIG. 5, for example, when writing the first row of cells, the column input current for the 1st row, j-th column to be written in the Memory Cell (j, 1), is directed to the j-th column line 500 by throwing the column switch Scj to position "1." The write-enable signal WE1 and the row-select signal RS1 of the first row, Row 1, are set to "1" to write the column current in the selected cell. The charge pump select signals for all rows, CPS1 through CPSN, are all normally set to "1," and the charge pump signal for all columns, CP1 through CPM, are normally set to "0." The CPS and $C_P$ signals are changed only when the charge pump injects a small amount of charge to increase the stored current by $I_q$ to compensate for the droop in the stored current as in the first embodiment of the invention. Immediately after cells in Row 1 are written, the write enable signal WE1 for Row 1 is set to "0" disabling the write operation, while the row select signal for the same row remains at "1."

In Step 2, a current ramp signal is applied to each column by throwing each column switch Scj to position "2." Each column further comprises a comparator, and a column control circuit, for example, for Column 2, COMP2 and Column Controller 2. The comparator flips at the time the ramp current $I_{ramp}$ exceeds the column current $I_c$, which is equal to the current stored in the first cell in the column, because the row select signal RS1 of the first row is "1" directing the stored current in the current memory cells in the first row to the respective column lines. The CPS1 signal is set to "0" to arm the charge pumps on Row 1. If the comparator flipping clock phase is "1," the $C_P$ signal for that column remains at "0." However, if the comparator flipping clock phase is "0," the $C_P$ signal pulses to "1" for a predetermined period of time. This turns the corresponding CP transistor briefly to inject a small amount of positive charge to the capacitance $C_P$ to increase the cell current by $I_q$.

Alternatively, if the comparator flipping clock phase is "0," the $C_P$ signal for that column remains at "0," and if the comparator flipping clock phase is "1," the CP signal pulses to "1" for a predetermined period of time to inject a small amount of positive charge to the capacitance $C_P$ to increase the cell current by $I_q$.

Next, the same operations, Step 1 and Step 2, continue to Row 2, then Row 3, etc. until the last row, Row M.

Once all rows of the memory array are written, Step 2 operations continue in a sequential manner from Row 1 to Row M, continuously repeating until memory cells are written again with new data. The sequential Step 2 operations are interrupted when the memory cell currents are read out. The droop compensation method in the third embodiment is similar to that in the second embodiment, thus avoids the SRAM requirement in the first embodiment at the cost of a slight increase in error bounds.

A fourth embodiment according to the present invention is similar to the third embodiment, but further comprises a digital memory for each memory cell. The digital memory stores the clock phase on which the comparator flips the first time after the cell is written, in the similar fashion to the first embodiment of the invention. The digital memory can be located in any of the controllers, such as in the row controllers and/or in the column controllers (e.g., as discussed with respect to FIG. 5). Alternatively, the digital memory can be operatively coupled to any of the controllers while remaining on chip (e.g., on the same substrate, such as the same CMOS substrate, as the controller(s)). The column $C_P$ signal is pulsed when the comparator flipping clock phase change from the stored clock phase as in the first embodiment. Although this embodiment increases complexity because it requires one-bit digital memory per current memory cell, the accuracy is better, comparable to the first embodiment of the invention.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. As a specific example, it may be desired to use PMOS transistors in the current memory circuits instead of the NMOS input transistors as shown in the example figures. Such "flipped" configurations will be appreciated by those who are skilled in the art. It is, therefore, to be understood that the foregoing embodiments are presented by way of example only and that, within the scope of the appended claims and equivalents thereto, inventive embodiments may be practiced otherwise than as specifically described. Inventive embodiments of the present disclosure are directed to each individual feature, system, article, material, kit, and/or method described herein. In addition, any sensible combination of two or more such features, systems, articles, materials, kits, and/or methods, if such features, systems, articles, materials, kits, and/or methods are not mutually inconsistent, is included within the inventive scope of the present disclosure.

Also, the invention described herein may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. An analog current memory circuit operable in a write phase and a compensation phase, the compensation phase repeating a plurality of times after each write phase, comprising:
   a ramp current generator producing a ramp current;
   a storage transistor, a write-enable transistor, and a charge pump transistor;
   a clock generator producing a clock signal having a first state and a second state;
   a comparator electrically coupled to the storage transistor and the ramp current generator;
   a controller electrically coupled to the comparator and the clock generator; and
   a switch electrically coupled to the controller and the ramp current generator;
   wherein during the write phase, the controller produces a write-enable signal to turn on the write-enable transistor to produce a stored current in the storage transistor, the stored current being substantially equal to an input current to the analog current memory circuit; and
   during the compensation phase, the switch electrically couples the ramp current generator and the storage transistor to the comparator.

2. The analog current memory circuit of claim 1, wherein the comparator flips at a time the ramp current exceeds the stored current; and
   the controller produces a charge pump signal to turn on the charge pump transistor to increase the stored current by a predetermined increment when the comparator flips during the first state of the clock signal.

3. The analog current memory circuit of claim 2, wherein the storage transistor and the write-enable transistor comprise NMOS transistors and the charge pump transistor comprises a PMOS transistor.

4. The analog current memory circuit of claim 2, wherein the first state of the clock phase is "1".

5. The analog current memory circuit of claim 2, wherein the first state of the clock phase is "0".

6. The analog current memory circuit of claim 1, wherein the controller comprises a digital memory having a first and a second memory state, wherein:

during a first compensation phase after the write phase, said digital memory is set to the first memory state when the comparator flips during the first state of the clock signal;

said digital memory is set to the second memory state when the comparator flips during the second state of the clock signal;

during subsequent compensation phases after the write phase, the controller produces a charge pump signal to turn on the charge pump transistor to increase the stored current by a predetermined increment when the comparator flips during the second state of the clock signal when the digital memory is set to the first memory state; and the controller produces a charge pump signal to turn on the charge pump transistor to increase the stored current by a predetermined increment when the comparator flips during the first state of the clock signal when the digital memory is set to the second memory state.

7. The analog current memory circuit of claim 1, wherein the storage transistor and the write-enable transistor comprise NMOS transistors and the charge pump transistor comprises a PMOS transistor.

8. An analog current memory circuit organized in a plurality of rows and columns, each column comprising:
a plurality of current memory cells each memory cell operable in a write phase and a compensation phase, and each memory cell comprising a storage transistor, a write-enable transistor, a row select transistor, and a charge pump transistor;
a column line electrically coupled to said plurality of current memory cells;
a ramp current generator producing a current ramp;
a comparator electrically coupled to the column line and a bias voltage;
a clock signal having a first state and a second state;
a column switch electrically coupled to a column input current and the ramp current generator; and
a column controller electrically coupled to the plurality of memory cells and the comparator.

9. The analog current memory circuit of claim 8 further comprising a plurality of row controllers, each row controller producing a write enable signal, a row select signal, and a charge pump select signal for a respective row.

10. The analog current memory circuit of claim 9, wherein:
during the write phase of each row, each row controller produces the write-enable signal for the respective row, turning on the write-enable transistors in the current memory cells in the respective row;
each column input current is electrically coupled to a respective column line and a respective column switch; and
each column input current is stored in the storage transistor of the current memory cell in the respective column in the row.

11. The analog current memory circuit of claim 10, wherein:
during the compensation phase of each row, each row controller produces the row select signal and the charge pump select signal for the respective row, directing the output currents of the storage transistors of the current memory cells in the respective row to the respective column lines;
each column controller produces a charge pump signal when the comparator in the respective column flips during the first state of the clock signal; and
said charge pump signal is electrically coupled to the charge pump transistor and the storage transistor of the current memory cell of the respective column in the row, incrementing the output current of the storage transistor in the same current memory cell by a predetermined amount.

12. The analog current memory circuit of claim 10, wherein:
each column controller comprises a digital memory having a first and a second memory state for the respective row;
during a first compensation phase after the write phase for each row, said digital memory is set to the first memory state when the comparator in the respective column flips during the first state of the clock signal;
said digital memory is set to the second memory state when the comparator in the corresponding column flips during the second state of the clock signal;
during the second and the subsequent compensation phases after the write phase for each row, each column controller produces a charge pump signal to turn on the charge pump transistor in the current memory cell of the respective column in the row to increase the output current of a respective storage transistor by a predetermined increment when the comparator in the corresponding column flips in the second state of the clock signal when the digital memory is set to the first memory state; and
the column controller produces the charge pump signal to turn on the charge pump transistor to increase the output current of the respective storage transistor by a predetermined increment when the comparator in the corresponding column flips during the first state of the clock signal when the digital memory is set to the second memory state.

13. The analog current memory circuit of claim 8, wherein the storage transistor, the write-enable transistor, and the row select transistor comprise NMOS transistors; and the charge pump transistor comprises a PMOS transistor.

14. The analog current memory circuit of claim 8, wherein:
the storage transistor, the write-enable transistor, and the row select transistor comprise PMOS transistors; and
the charge pump transistor comprises an NMOS transistor.

* * * * *